United States Patent [19]

Woodward et al.

[11] Patent Number: 4,988,424

[45] Date of Patent: Jan. 29, 1991

[54] MASK AND METHOD FOR MAKING GRADIENT SPUTTERED COATINGS

[75] Inventors: Danny L. Woodward, Huntsville, Ala.; Chester Thrasher, Elora, Tenn.

[73] Assignee: PPG Industries, Inc., Pittsburgh, Pa.

[21] Appl. No.: 362,645

[22] Filed: Jun. 7, 1989

[51] Int. Cl.$^5$ .............................................. C23C 14/34
[52] U.S. Cl. ........................... 204/192.29; 204/192.12; 204/298.11; 204/298.29; 118/504; 118/505; 427/282
[58] Field of Search ........... 204/192.1, 192.11, 192.12, 204/192.29, 298 MS, 298 TT, 298.06, 298.11, 298.29; 118/504, 505; 427/282

[56] References Cited

U.S. PATENT DOCUMENTS

| | | | |
|---|---|---|---|
| 3,652,443 | 3/1972 | Fish et al. | 204/298 MS |
| 3,715,940 | 12/1987 | Boudreau | 204/192.1 |
| 3,907,660 | 9/1975 | Gillery | 204/298 |
| 4,166,018 | 8/1979 | Chapin | 204/192.12 |
| 4,303,489 | 12/1981 | Morrison, Jr. | 204/192.12 |
| 4,407,709 | 10/1983 | Enjouji et al. | 204/192.13 |
| 4,414,087 | 11/1983 | Meckel | 204/192.2 |
| 4,426,274 | 1/1984 | Ephrath | 204/298 |
| 4,426,275 | 1/1984 | Meckel et al. | 204/298 |
| 4,428,809 | 1/1984 | Heimbach et al. | 204/192.29 |
| 4,431,505 | 2/1984 | Morrison | 204/298 |
| 4,478,702 | 10/1984 | Gillery et al. | 204/298 |
| 4,600,490 | 7/1986 | Gillery et al. | 204/298 |
| 4,744,880 | 5/1988 | Gillery et al. | 204/298 |

FOREIGN PATENT DOCUMENTS

| | | | |
|---|---|---|---|
| 54-32438 | 10/1979 | Japan | 204/298 MS |
| 63-103068 | 5/1988 | Japan | 204/298.11 |
| 63-118062 | 5/1988 | Japan | 204/298 MS |

OTHER PUBLICATIONS

Handbook of Thin Film Technology, Maissel et al., (McGraw-Hill, New York, 1970) pp. 4-13 to 4-20.

Primary Examiner—Aaron Weisstuch
Attorney, Agent, or Firm—Dennis G. Millman

[57] ABSTRACT

Sputtered coatings of gradient thicknesses are produced by employing a foraminous mask between the cathode and the substrate. The size of openings in the foraminous mask may be varied in different areas to provide versatility in controlling the gradient patterns. The invention is particularly suitable for producing gradient electroconductive heating films on transparencies.

13 Claims, 2 Drawing Sheets

MASK AND METHOD FOR MAKING GRADIENT SPUTTERED COATINGS

BACKGROUND OF THE INVENTION

This invention relates to coating substrates by sputtering, and in particular to producing gradient coatings, that is, coatings of varying thickness across a surface of a substrate. An example of a field in which this capability is useful is in applying transparent, electroconductive coatings to transparencies to serve as resistance heating means, wherein it may be desired to provide greater resistance in some areas of the transparency than in others.

U.S. Pat. No. 4,744,880 (Gillery et al.) discloses a shaped anode in a sputter coating arrangement for producing a gradient coating. The gradation is effected by generalized shaping of the electric field, therefore that approach is not suitable for complex patterns or for sharply defined gradients. Also, for coating substrates that require scanning the sputtering electrodes over the substrate, a limited range of gradient patterns would be possible.

U.S. Pat. No. 4,600,490 (Gillery et al.) discloses an anode configured as a mesh in a sputtering electrode arrangement, and mentions that the mesh anode may be shaped in order to produce gradients in the deposited film. Because this arrangement is based on shaping the anode, it would have the same drawbacks of the patented arrangement discussed above.

The use of masks to produce patterned coating is known in the sputtering art as disclosed in U.S. Pat. No. 4,428,809 (Heimbach et al.). These masks are usually constructed of solid sheet material with openings cut out. This type of mask is not as versatile as would be desired for making gradients in the deposited coating thickness.

The effect of cathode shields on coating thickness is discussed in the "Handbook of Thin Film Technology," by Maissel et al. (McGraw-Hill, New York, 1970) on pages 4–13 to 4–15. It is proposed there that a shield with one or more apertures covering the face of a cathode would permit sputtering onto selected areas of a substrate. As in the case of shaped anodes, this approach is not as adaptable as would be desired for producing gradient coatings, particularly when the cathode and the substrate move relative to each other during sputtering.

U.S. Pat. No. 4,426,274 (Ephrath) shows a perforated anode with differential blocking of some of the apertures in a vacuum discharge system. However, the patent deals with etching rather than coating and the objective is to render the etching more uniform rather than to produce gradient effects.

It would be desirable to be able to apply sputtered coatings with greater flexibility than has heretofore been available as to the shapes of areas having different coating thicknesses, the amount of variation of coating thickness in different areas of a substrate, and the degree of gradation between areas of different thickness.

SUMMARY OF THE INVENTION

Sputtered coatings having gradient thicknesses are made in accordance with the present invention by means of a foraminous mask member interposed between the cathode and the substrate being coated during sputtering. The foraminous mask partially blocks deposition of the sputtered material on the area of the substrate behind the mask, thereby creating an area of reduced coating thickness. For areas in which even less deposition is desired, an impervious, shaped plate or the like may be supported on the foraminous mask in the corresponding region. Openings may be provided in the foraminous mask, or portions of the substrate may be uncovered by the mask in regions where the full coating thickness is desired. Intermediate levels of partial masking may be provided in selected areas by means of a double layer of foraminous material with the apertures out of alignment for less deposition, or by means of a group of larger apertures cut into the foraminous mask for more deposition. Thus, the foraminous mask provides a versatile base for making a wide range of adjustments to the local deposition rate, whereby smooth gradients in the coating thickness can be produced in virtually any size or shape. Furthermore, these adjustments can be made quickly and inexpensively.

The foraminous mask of the present invention may be comprised of any substantially planar element having a large number of apertures, such as a screen, expanded mesh, or punched plate. Apertures of varying diameter or spacing may be made in a blank sheet, but it is much more convenient and versatile to use a stock material that is uniformly apertured and to add layers or cut openings to customize the gradient pattern.

THE DRAWINGS

DETAILED DESCRIPTION

The description herein will be with particular reference to coating transparencies, but it should be apparent that the invention is not limited to any particular type of coating or product, but has applicability to sputter coating in general. The transparencies with which the present invention may be practiced include curved or flat sheets of glass and/or plastic. The coating may be metal or metal oxides. An example of an indium oxide coating method and apparatus suitable for use in conjunction with the present invention are disclosed in U.S. Patent No. 3,907,660 (Gillery), the disclosure of which is hereby incorporated by reference.

Figure 1:
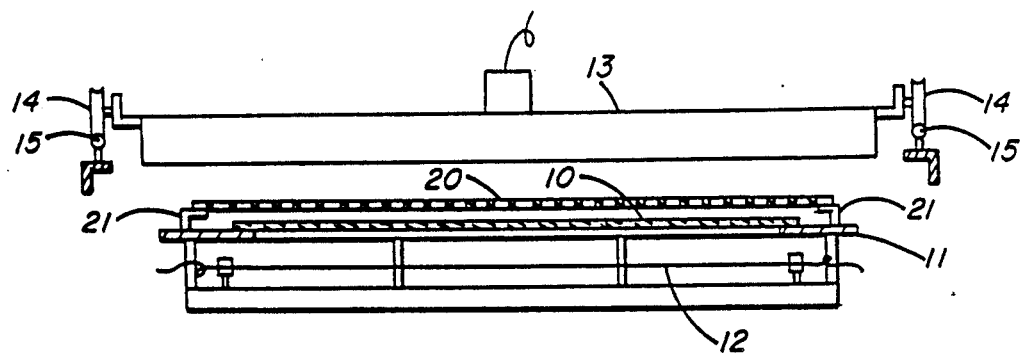
FIG. 1 is a schematic end view of a cathodic sputtering apparatus incorporating the foraminous mask feature of the present invention.
Figure 4:
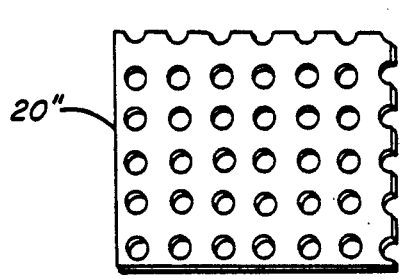

Referring to FIG. 1, a substrate 10 is shown resting on a fixture 11 which may be formed of a metal sheet with the center cut out in approximately the outline of the substrate 10 but with slightly smaller dimensions so as to support the substrate around its periphery. If the substrate is curved, the fixture 11 may also be provided with a corresponding curvature. Although the elements of the coating apparatus of FIG. 1 are shown with a horizontal orientation, a sloped orientation is also used. The fixture 11 is designed to provide exposure of the substrate to heating elements 12 below the fixture. The heating elements 12 may be electric resistance heating elements and serve to maintain the substrate 10 at the proper temperature for sputter coating. On the opposite side of the substrate from the heating elements is a cathode assembly 13 mounted for reciprocation over the substrate by way of wheels 14 and rails 15. Relative motion between the cathode assembly and the substrate permits a larger area to be sputter coated than with a stationary arrangement. Although not preferred, the cathode could remain stationary while the substrate is moved. The cathode assembly 13 carries a cathode target of the metal that is to be sputtered as well as an anode. The present invention may be used with or without magnetic (magnetron) enhanced sputtering. The entire apparatus of FIG. 1 is enclosed within a vacuum chamber (not shown) during sputtering. In FIG. 1 a mask 20 in accordance with the present invention is shown mounted on the fixture 11 by means of brackets 21. The mask 20 could be made of any material that can withstand the temperature and chemical conditions of the sputtering operation, and is preferably metal due to its rigidity at the temperatures involved and ease of working. Suitable metals for the mask include stainless steel, copper, and titanium, and other metals may also be suitable. The mask 20 is spaced from the substrate 10, the distance of the spacing varying in accordance with the sharpness of the image of the mask that is to be reproduced in the coating deposited on the substrate. In some cases it may be desired to create a sharply focussed line between thickly and thinly coated areas, in which case the mask is spaced a relatively small distance from the surface of the substrate. In other cases a less distinct gradient may be desired, and the mask is spaced relatively farther from the substrate. The invention is not inherently limited to any particular range of spacings, examples of spacings that have been employed successfully range from ¼ inch to 2 inches. Several examples of material from which the mask 20 may be fabricated are depicted in FIGS. 2-4.

Figure 2:
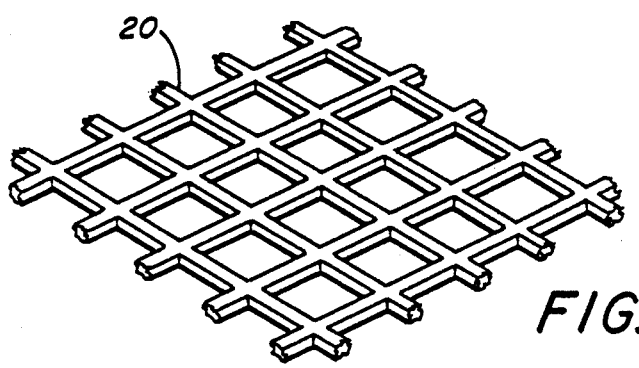
FIGS. 2 through 4 are enlarged representations of examples of foraminous materials from which the mask of the present invention may be fabricated, FIG. 2 showing expanded mesh, FIG. 3 showing screen (wire cloth) material, and FIG. 4 showing a perforated plate.

The mask 20 in FIG. 2 is comprised of expanded metal mesh, a material which is advantageously rigid but readily bendable for contouring to the shape of curved substrates. Expanded metal mesh is available with openings in a variety of sizes. The choice of opening size will be influenced by the spacing of the mask from the substrate and the pattern effect that is desired. The invention is not limited to any particular opening size, but examples of opening sizes that have been used range from approximately ¼ by ¼ inch up to 1 by 2 inches. The amount of open space depends upon the effect desired, but in general it is preferred that the base material of the mask have at least about forty percent of its area open. An expanded metal mesh that has been found suitable has a thickness of 16 gauge, but other thicknesses may also be suitable.

Figure 3:
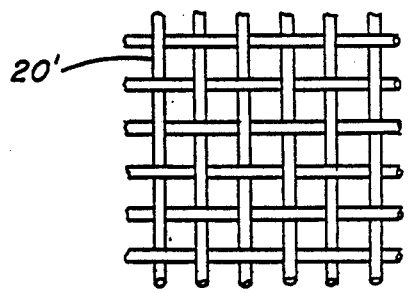

The mask 20' in FIG. 3 takes the form of screen or wire cloth. In FIG. 4 the mask 20'' is a perforated sheet. The considerations regarding spacing and openness discussed above in connection with the expanded metal mesh embodiment apply as well to the alternative materials for the mask. The openings in the perforated sheet of FIG. 4 are shown as being circular, but could be square or any other shape.

Figure 5:
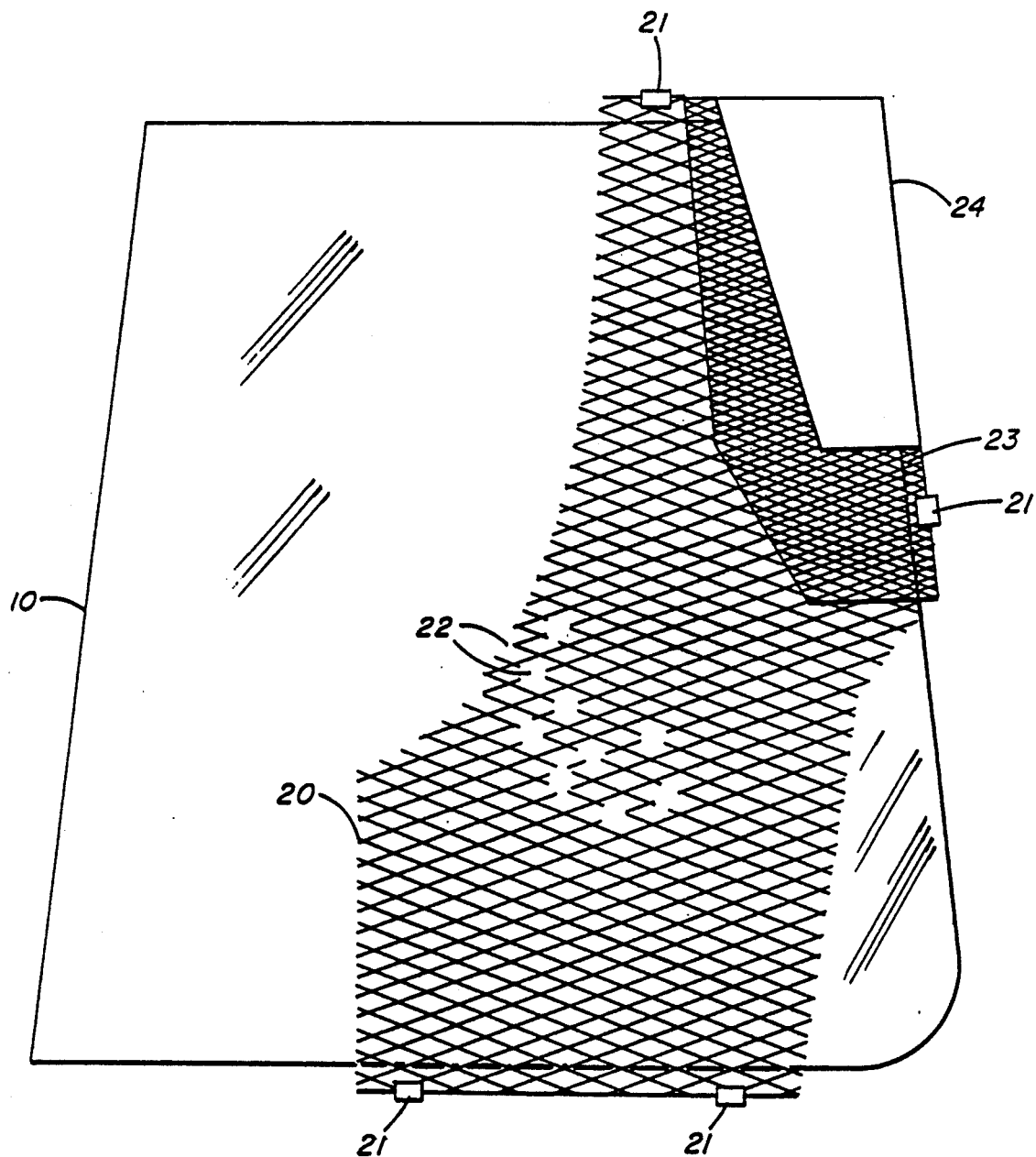
FIG. 5 is a top view of an example of a composite mesh mask in place over a substrate in accordance with the present invention.

Referring now to FIG. 5 there is illustrated an example of a composite mask in place over a substrate 10 in which the base of the mask 20 is a material having a regular pattern of openings, but which has been modified to increase the openness in some areas and to decrease the openness in other areas. Some areas of the substrate are not masked at all. Other regions have enlarged openings 22 created by cutting away small portions of the mesh. To decrease the size of the openings, another layer of mesh 23 is placed onto the mask 20 with the openings out of alignment. The misalignment may be to varying degrees, and the added piece of mesh 23 may have the same or different sized openings as the base mesh 20. Therefore, a wide variety of blockage can be achieved by means of the additional layer of mesh. For areas where maximum masking is required, a solid sheet 24 may be placed onto the base mask 20. By manipulating these variables of the mesh mask, a great deal of versatility in controlling deposition of gradient coatings is available.

The invention has been described in connection with particular embodiments in order to disclose the best mode of the invention, but it should be understood that other variations and modifications as are known to those of skill in the art may be resorted to without departing from the invention as defined by the claims that follow.

We claim:

1. Apparatus for sputter coating a substrate with a coating having gradations in thickness comprising a sputtering target electrode, substrate support means adapted to support a substrate to be coated in facing relationship to the target electrode, the substrate being substantially larger in area than the target electrode, the target electrode and the substrate support having means associated therewith for providing reciprocating relative motion therebetween, a foraminous mask member having a large number of apertures between the target electrode and at least a portion of the substrate and spaced therefrom a distance sufficient to partially block deposition of sputtered material from the electrode onto said at least a portion of the substrate.

2. The apparatus of claim 1 wherein the foraminous mask has openings of one size in one area and openings of a different size in other areas.

3. The apparatus of claim 2 wherein the foraminous mask includes at least two layers of foraminous material in at least some portions.

4. The apparatus of claim 2 wherein at least one enlarged opening is provided in at least one of said areas of the foraminous mask, the enlarged opening being larger than other openings in that area of the mask.

5. The apparatus of claim 1 wherein the foraminous mask includes at least one non-foraminous area.

6. The apparatus of claim 5 wherein the non-foraminous area includes a solid sheet carried on the foraminous mask.

7. The apparatus of claim 1 wherein the foraminous mask includes expanded mesh material.

8. The apparatus of claim I wherein the foraminous mask includes screen material.

9. The apparatus of claim 1 wherein the foraminous mask includes perforated sheeting.

10. A method of sputter coating a substrate with a coating having gradations in thickness wherein a coating is sputtered from a target electrode onto the substrate which is of substantially larger area than the target electrode, reciprocating relative motion is provided between the substrate and the target electrode during sputtering, and the deposition of the coating onto at least a portion of the substrate is partially masked by means of a foraminous mask having a large number of apertures interposed between the electrode and said at least portion of the substrate and spaced therefrom a sufficient distance to produce gradations in the coating thickness.

11. The method of claim 10 wherein the substrate is a transparent sheet.

12. The method of claim 11 wherein the coating is a transparent, electroconductive coating.

13. The method of claim 10 wherein the partial masking is more complete in some areas of the foraminous mask than in other areas in accordance with the distribution of openings in the foraminous mask, whereby a gradient coating is produced.

* * * * *